United States Patent
She et al.

(10) Patent No.: US 11,591,270 B2
(45) Date of Patent: Feb. 28, 2023

(54) DOPED SILICON CARBIDE CERAMIC MATRIX COMPOSITE

(71) Applicant: United Technologies Corporation, Farmington, CT (US)

(72) Inventors: Ying She, East Hartford, CT (US); Andrew J. Lazur, Laguna Beach, CA (US); Kathryn S. Read, Marlborough, CT (US)

(73) Assignee: Raytheon Technologies Corporation, Farmington, CT (US)

( * ) Notice: Subject to any disclaimer, the term of this patent is extended or adjusted under 35 U.S.C. 154(b) by 303 days.

(21) Appl. No.: 16/785,142

(22) Filed: Feb. 7, 2020

(65) Prior Publication Data

US 2020/0255351 A1 Aug. 13, 2020

Related U.S. Application Data

(60) Provisional application No. 62/803,249, filed on Feb. 8, 2019.

(51) Int. Cl.
*C04B 41/87* (2006.01)
*C04B 35/565* (2006.01)

(52) U.S. Cl.
CPC ............ *C04B 41/87* (2013.01); *C04B 35/565* (2013.01); *C04B 2235/5212* (2013.01); *C04B 2235/5244* (2013.01)

(58) Field of Classification Search
CPC .................................................. C04B 35/565
See application file for complete search history.

(56) References Cited

U.S. PATENT DOCUMENTS

| | | | |
|---|---|---|---|
| 9,650,303 B2 | 5/2017 | Chamberlain et al. | |
| 10,047,610 B2 | 8/2018 | Jadidian et al. | |
| 10,530,125 B1* | 1/2020 | Venkatesan | H01S 3/1628 |
| 2005/0014349 A1* | 1/2005 | Carey | H01S 5/18305 |
| | | | 438/47 |
| 2014/0273681 A1 | 9/2014 | Chamberlain et al. | |
| 2016/0102022 A1* | 4/2016 | Chamberlain | C04B 35/62868 |
| | | | 501/88 |

(Continued)

FOREIGN PATENT DOCUMENTS

| | | |
|---|---|---|
| EP | 2970015 A1 | 1/2016 |
| EP | 2970017 A2 | 1/2016 |

(Continued)

OTHER PUBLICATIONS

Extended European Search Report for EP Application No. 20156437.4, dated Jun. 25, 2020, 8 pages.

*Primary Examiner* — Robert A Vetere
(74) *Attorney, Agent, or Firm* — Kinney & Lange, P.A.

(57) ABSTRACT

A method for forming ceramic matrix composite (CMC) component includes forming a fiber preform, positioning the fiber preform into a chemical vapor infiltration reactor chamber, and densifying the fiber preform. Densification includes infiltrating the fiber preform with a first gas comprising precursors of silicon carbide and infiltrating the fiber preform with a second gas comprising a first rare earth element, wherein the steps of infiltrating the fiber preform with the first gas and infiltrating the fiber preform with the second gas are conducted simultaneously to produce a first rare earth-doped silicon carbide matrix in a first region of the component.

17 Claims, 3 Drawing Sheets

(56) References Cited

U.S. PATENT DOCUMENTS

2016/0159701 A1\* 6/2016 Lazur ................ C04B 35/62868
428/366
2017/0096345 A1\* 4/2017 Shero .................... C01B 32/921

FOREIGN PATENT DOCUMENTS

WO     WO2014159556 A2    10/2014
WO     WO2017/194886 A1    11/2017

\* cited by examiner

DOPED SILICON CARBIDE CERAMIC MATRIX COMPOSITE

CROSS-REFERENCE TO RELATED APPLICATION(S)

This application claims the benefit of U.S. Provisional Application No. 62/803,249, filed Feb. 8, 2019, for "DOPED SILICON CARBIDE CERAMIC MATRIX COMPOSITE" by Y. She, A. Lazur, and K. Read.

BACKGROUND

The present disclosure relates generally to ceramic matrix composites (CMCs) and more particularly to a method of manufacturing ceramic matrix composite components for use in gas turbine engines.

Lightweight CMC is a highly desirable material for gas turbine engine applications. CMCs exhibit excellent physical, chemical, and mechanical properties at high temperatures and are particularly suited for producing hot section components for gas turbine engines. CMCs, however, are susceptible to oxidation, which can increase recession rate and component service life.

Improved matrix materials and methods of manufacture are needed to limit the impact of oxidation of CMC components in operation.

SUMMARY

In one aspect, a method for forming ceramic matrix composite (CMC) component includes forming a fiber preform, positioning the fiber preform into a chemical vapor infiltration reactor chamber, and densifying the fiber preform. Densification includes infiltrating the fiber preform with a first gas comprising precursors of silicon carbide and infiltrating the fiber preform with a second gas comprising a first rare earth element, wherein the steps of infiltrating the fiber preform with the first gas and infiltrating the fiber preform with the second gas are conducted simultaneously to produce a first rare earth-doped silicon carbide matrix in a first region of the component.

In another aspect, a ceramic matrix composite (CMC) includes a plurality of fibers and a first rare earth-doped silicon carbide matrix region surrounding the plurality of fibers. The first rare earth-doped silicon carbide matrix region comprises a first rare earth element.

The present summary is provided only by way of example, and not limitation. Other aspects of the present disclosure will be appreciated in view of the entirety of the present disclosure, including the entire text, claims and accompanying figures.

Figure 1:
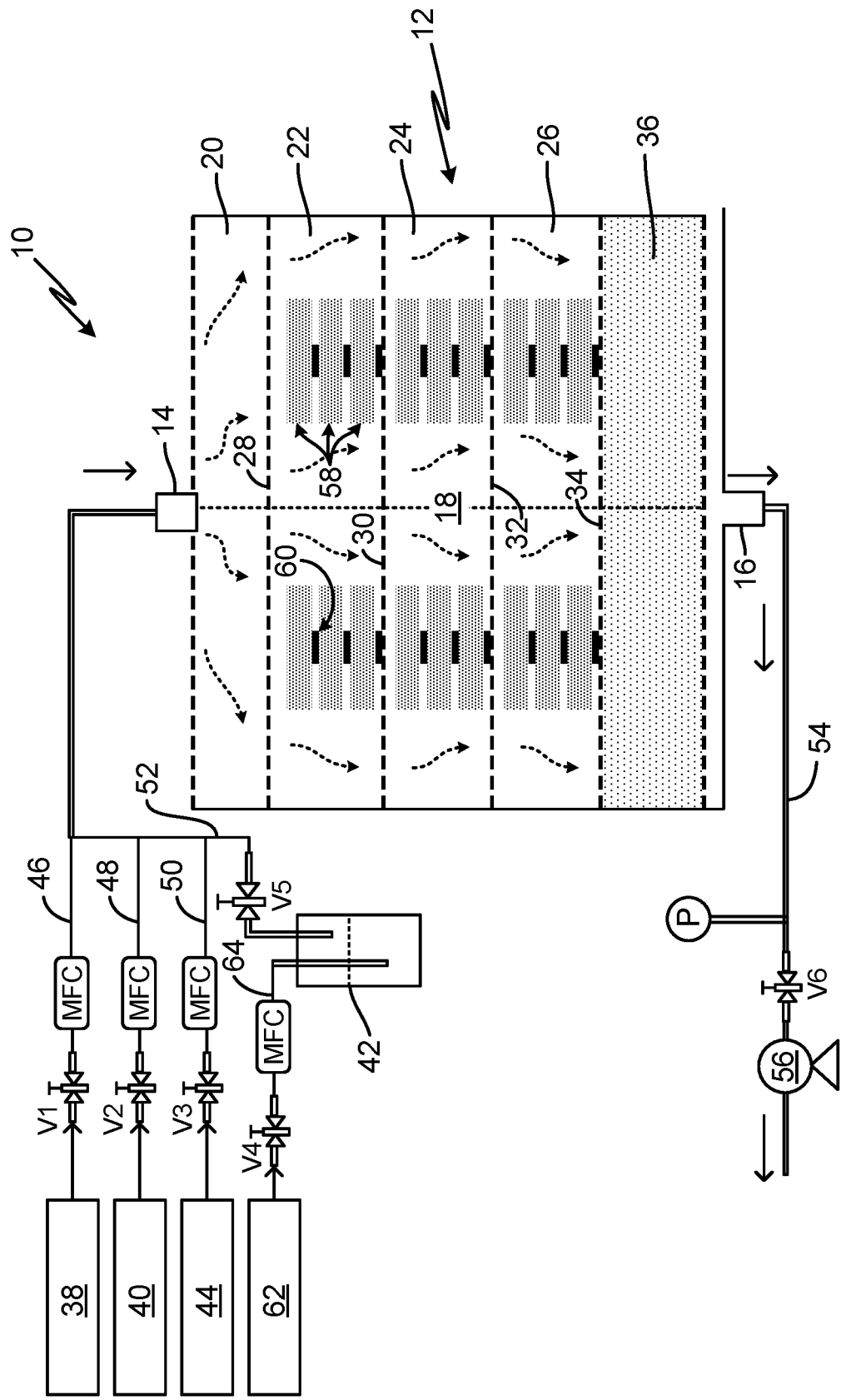
FIG. 1 is a schematic view of a chemical vapor infiltration/deposition (CVI/CVD) system for producing a rare earth-doped silicon carbide matrix for fiber preforms.

While the above-identified figures set forth embodiments of the present invention, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features, steps and/or components not specifically shown in the drawings.

DETAILED DESCRIPTION

CMCs can be improved by incorporating rare earth elements into a silicon carbide (SiC) matrix. The rare earth dopants promote the formation of silicate upon oxidation, which is more stable at high temperatures than silica, which is formed in the absence of rare earth dopants. The rare earth dopant and SiC precursors can be simultaneously delivered to a fiber preform to form a rare earth-doped SiC matrix. Using a chemical vapor infiltration (CVI) process, rare earth dopants can be uniformly distributed in the SiC matrix or graduated in concentration to provide protection in regions more susceptible to oxidation or damage (e.g., outer region of the component or fibers of the preform) by adjusting a gas flow rate of the rare earth dopant into the CVI reactor. The doped SiC matrix can mitigate recession of components during operation and increase component lifetime. Components formed using the disclosed method can include but are not limited to hot section components of a gas turbine engine, such as turbine blades, vanes, seals or shrouds, and platforms; combustors; and exhaust nozzles or mixers.

FIG. 1 is a schematic view of CVI assembly 10 for the manufacture of CMC components. CVI assembly 10 is designed to densify fiber preforms with a rare earth-doped SiC matrix. CVI assembly 10 includes reactor 12, having gas inlet 14, gas outlet 16, and reaction chamber 18. Reaction chamber 18 can be subdivided into a plurality of levels or sub-chambers 20-26, defined between gas distributor plates 28-34, and can include reaction completion bed 36 adjacent to outlet 16. CVI assembly 10 further includes a plurality of reactant gas sources 38-42, purge gas source 44, a plurality of gas lines 46-54 fluidly connected to reactor 12 and operable via valves V1-V6, vacuum pump 56 fluidly connected to outlet 16, and a heat source (not shown). In some embodiments, CVI assembly 10 can include a controller (not shown), which can be communicatively coupled to the heat source, valves V1-V6, vacuum pump 56, and other components of CVI assembly 10, including pressure monitor P, to facilitate operation of CVI assembly 10.

Reactor 12 can be an isobaric reactor as known in the art, configured to house one or more fiber preforms 58 and to facilitate chemical vapor infiltration of a plurality of reactant gases into fiber preforms 58. A plurality of fiber preforms 58 can be stacked inside reaction chamber 18, separated by spacers 60. Spacers 60 can be porous structures capable of separating adjacent fiber preforms 58 within a stack, while allowing gas to flow between adjacent fiber preforms 58, into fiber preforms 58, and onto external surfaces of fiber preforms 58. Gas distributor plates 30-34 can be used to provide support (e.g., shelves) for multiple fiber preforms within reaction chamber 18 and to facilitate reactant gas redistribution among levels 22-26. Gas distributor plates 28-34 can be perforated or otherwise porous members that allow for diffusion or flow of reactant gas between chambers 20-26 and into completion bed 36. It will be understood by one of ordinary skill in the art that the number of levels as well as the height of each level can be increased or decreased depending on the application, number, and size of the fiber preforms 58. The disclosed CVI assembly 10 and method can be used to densify a plurality of fiber preforms 58 at a time or a single fiber preform 58. It will be understood that reactor 12 can have alternative constructions as known in the art and is not limited to the embodiment disclosed in FIG. 1.

Reactant gas can enter reactor 12 through gas inlet 14. As illustrated in FIG. 1, CVI assembly 10 can include a plurality of reactant gas sources 38, 40, and 42, fluidly connected to reactor 12 via gas conduits 46, 48, and 52, respectively. Reactant gases can be delivered to reaction chamber 18 in separate conduits, which can be bundled for delivery to inlet 14, as illustrated in FIG. 1. Valves V1, V2, V4, and V5 can be opened and closed to control the supply of reactant gases to reactor 12. Reactant gas source 38 provides precursors for a fiber interface coating, including but not limited to boron nitride precursors capable of forming a boron nitride coating on fibers of the fiber preform 58. Reactant gas source 40 provides precursors of SiC, such as methyl trichlorosilane (MTS) and hydrogen ($H_2$), which diffuse into porous fiber preforms 58 and react to form a SiC matrix. Reactant gas source 42 provides an organometallic dopant, such as tris-cyclopentadienyl ytterbium ($YbCp_3$), which diffuses into porous fiber preforms 58 to dope the SiC matrix with a rare earth element, which when oxidized, forms a silicate that is stable at high temperatures. Suitable rare earth dopants can include cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). Additionally, zirconium (Zr), niobium (No), molybdenum (Mo), hafnium (Hf), tantalum (Ta), and rhenium (Re) can form a silicate stable at high temperatures and can be used in place of the rare earth dopants. In some embodiments, CVI assembly 10 can include additional reactant gas sources 42 that differ in composition to dope the SiC matrix with different rare earth elements in different regions.

Gases can enter reaction chamber 18 in mixing chamber 20. Reactant gas can flow from gas inlet 14 toward gas outlet 16. Prior to exiting reactor 12, gases can enter completion bed 36 where unreacted gas can react, producing an exhaust gas. The exhaust gas can then be pulled from reaction chamber 18 through outlet 16 via vacuum pump 56. Radiative or thermal energy can be applied to reactor 12 to induce a chemical reaction. In some embodiments, reactant gas may be heated by a preheater prior to entering reactor 12 as known in the art.

Reactant gas source 42 can include a bubbler as known in the art containing a volatile liquid organometallic compound. A carrier gas 62 can be supplied to the bubbler via gas conduit 64 to produce the gaseous organometallic dopant, which can be delivered to reactor 12. Flow of the carrier gas can be controlled by valve V4 and a mass flow controller (MFC) as illustrated in FIG. 1. In some embodiments, different liquid organometallic compounds can be provided to the bubbler to introduce different rare earth elements into reactor 12. In alternative embodiments, multiple bubblers can be included in CVI assembly 10 to provide multiple reactant gas sources 42. In some applications, it may be desirable to form a CMC component having a rare earth-doped SiC matrix with different rare earth dopants in different regions of the component to address variations in operational conditions. For example, some rare earth silicates are more resistant to oxygen and/or steam and some are better suited to particular temperature regimes.

Purge gas can be delivered to reactor 12 to remove ambient air and unreacted gases from reaction chamber 18 prior to and/or following the delivery of reactant gases. Purge gas can be provided from purge gas source 44 to inlet 14 via gas conduit 50. Valve V3 and a mass flow controller can be used to control the flow of purge gas to reactor 12.

Figure 2:
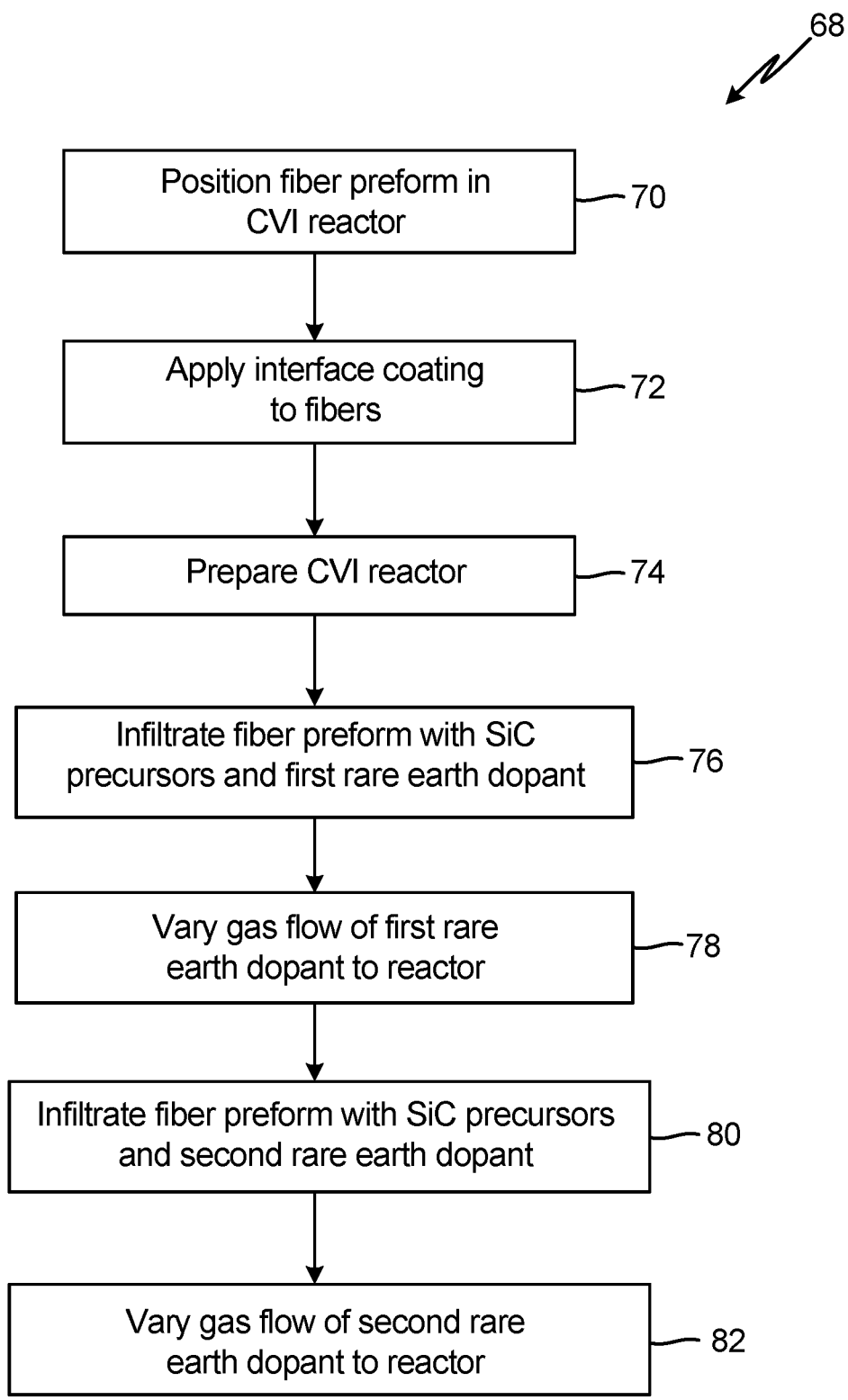
FIG. 2 is a flow chart of a method for producing a ceramic matrix composite having a rare earth-doped silicon carbide matrix.

FIG. 2 is a flow chart of method 68 for producing a CMC having a rare earth-doped SiC matrix using CVI assembly 10. Fiber preform 58 can be produced and positioned in reactor 12 for densification (step 70). Fiber preform 58 can comprise fibers or fiber tows, which can be woven, non-woven, or selectively placed. Exemplary fiber materials can include SiC and carbon. Other fiber materials are contemplated, including but not limited to silicon oxycarbide (SiOC), silicon nitride ($Si_3N_4$), silicon carbonitride (SiCN), hafnium carbide (HfC), tantalum carbide (TaC), silicon borocarbonitride (SiBCN), and silicon aluminum carbon nitride (SiAlCN). In some embodiments, an interface coating can be applied to fibers of fiber preform 58 by infiltrating fiber preform 58 with gas from reactant gas source 38 (step 72). Interface coatings can be applied to resist crack propagation and improve a bond between the fibers and matrix material. Interface coatings can include but are not limited to boron nitride. Valve V1 can be opened to allow flow of interface gases to reaction chamber 18. Once the fibers are coated, reactor 12 can be prepared for densification (step 74). Reactor 12 can be purged by an inert gas by closing valve V1 and opening valve V3 to introduce purge gas to reactor 12. Reactor 12 can be heated to a CVI process temperature for matrix densification.

Fiber preform 58 can be densified by simultaneously infiltrating fiber preform 58 with reactant gases from sources 40 and 42 to form a rare earth-doped SiC matrix (step 76). SiC precursors can be introduced into reactor 12 from reactant gas source 40 by opening valve V2 and a rare earth element can be introduced to reactor 12 to dope the SiC matrix by opening valves V4 and V5 while closing valve V3. Flow of each of the gases can be controlled by mass flow controllers (MFC) shown in FIG. 1 and can be varied to control the amount of the rare earth element in the doped SiC matrix (step 78). The proportion of the rare earth dopant to the SiC precursors can be varied to provide more or less of the rare earth element in different regions of preform 58. Generally, the amount of rare earth doping can be increased in regions more susceptible to oxidation (e.g., near outer region of the component) or where additional protection may be needed (e.g., around fibers). In a non-limiting example, a blade outer air seal (BOAS) can be formed with increased rare earth doping along a side of the BOAS exposed to hot combustion gases entering a turbine section of a gas turbine engine, and reduced rare earth doping along an opposite side of the BOAS exposed to a cooling fluid. In exemplary embodiments, the matrix can contain between 1 and 25 percent of the rare earth element by atomic percent.

The amount of the rare earth dopant in the SiC matrix can be reduced and/or increased by reducing and increasing, respectively, the flow of the organometallic gas stream to reactor 12. In some embodiments, a gas flow rate from reactive gas sources 40 and 42 can be maintained to provide a doped SiC matrix in which the rare earth element is substantially uniformly distributed. In some embodiments, a gas flow rate from reactive gas source 42 can be progressively increased or decreased to provide a continuous gradient of the rare earth element in the doped SiC matrix. In one non-limiting embodiment, the dopant gas flow rate from reactant gas source 42 to reactor 12 can be set to increase rare earth doping in the region immediately surrounding the fibers. The dopant gas flow rate can be progressively decreased as densification continues to provide a lower concentration of the rare earth element in a region outward from the fibers. In some embodiments, the dopant gas flow rate can be progressively increased from this lower concentration region to increase rare earth doping near an outer layer of the matrix.

One or more non-doped or pure SiC layers (hereinafter referred to simply as SiC layers or regions) can be provided in one or more SiC matrix regions by closing valves V4 and V5 to discontinue flow of the rare earth dopant to reactor 12. SiC matrix regions can be used to separate doped SiC matrix regions containing different rare earth dopants where interaction of the different dopants could lead to the formation of an undesirable compound. SiC matrix regions can also be disposed in regions of the component less susceptible to oxidation to reduce manufacturing costs. In some embodiments, it may be desirable to form an outermost layer of the matrix with SiC to improve interaction with an environmental barrier coating disposed on the component.

In some embodiments, two or more organometallic dopants can be alternately introduced to reactor 12 (step 80) to provide different rare earth elements to different regions of preform 58, which may be exposed to different environmental conditions when the component is in operation. Rare earth dopants can be selected based on the application and operational conditions (i.e., temperature, environmental contaminants, etc.). The second rare earth dopant can be introduced to reactor 12 from reactive gas source 42 by replacing the organometallic compound in the bubbler or from a separate bubbler assembly (not shown). The amount of the second rare earth dopant in the SiC matrix can be set by adjusting a gas flow rate of the second rare earth dopant to reactor 12. The gas flow rate can also be varied to provide a continuous gradient of the second rare earth metal in the SiC matrix (step 82). In some embodiments, dopant gas flow to reactor 12 can be shut off to provide a region of SiC between different doped SiC regions to limit reaction between different dopants.

Once the densification process is complete, reactor 12 can be purged and cooled down by opening valve V3, while closing valves V2, V4, and V5. Further processing, as known in the art, can be conducted to produce the finished component.

Figure 3A:
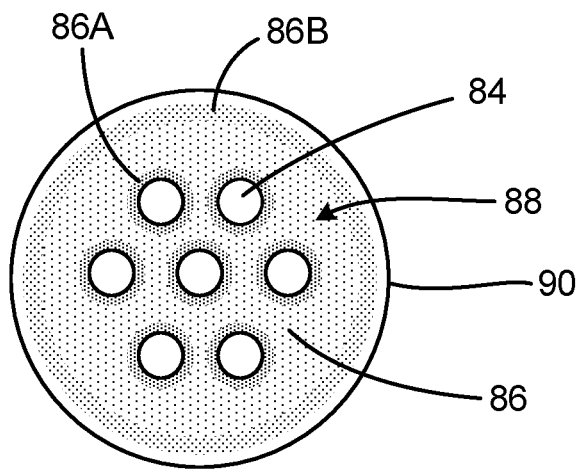
FIGS. 3A and 3B are schematic views of alternative embodiments of the rare earth-doped silicon carbide matrix formed using the system of FIG. 1.
Figure 3B:
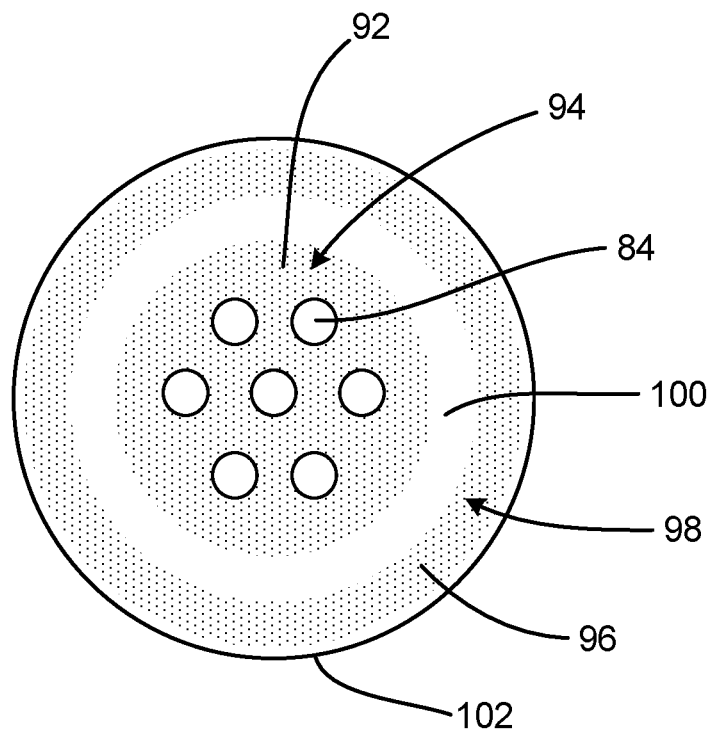

FIGS. 3A and 3B are schematic views of alternative embodiments of the rare earth-doped SiC matrix formed using CVI assembly 10 and method 68. The embodiment illustrated in FIG. 3A includes fibers 84, which can be coated with an interface coating (not shown), doped SiC matrix 86 surrounding fibers 84, and SiC matrix 90 surrounding doped SiC matrix 86 and forming an outermost layer of the matrix. Doped SiC matrix 86 can have a substantially uniform distribution of the rare earth element 88 or can have a substantially continuous dopant gradient. As illustrated in FIG. 3A, the rare earth element concentration can be greatest in region 86A nearest fibers 84 and in region 86B nearest outermost layer 90 of the matrix to protect fibers 84 and limit recession due to oxidation near the surface of the component during operation. In some embodiments, the doped SiC can form the entirety of the matrix extending to the outermost layer, however, a low concentration of dopant or SiC layer 90 may be preferred for interaction with an environmental barrier coating.

The embodiment illustrated in FIG. 3B includes fibers 84, which can be coated with an interface coating (not shown), doped SiC matrix region 92 with rare earth element 94, doped SiC matrix region 96 with rare earth element 98, and SiC matrix regions 100 and 102. Doped SiC matrix regions 92 and 96 can be formed by the infiltration of different organometallic dopants that introduce different rare earth elements 94, 98 into the matrix. Doped SiC matrix region 92 can be located in a region nearest fibers 84. SiC matrix region 100 can be disposed between doped SiC regions 92 and 96 to limit reaction between doped SiC regions 92 and 96. SiC region 102 can form an outermost layer of the matrix as may be preferred for interaction with an environmental barrier coating.

Rare earth dopants can be incorporated into a conventional CVI process used to densify fiber preforms with a SiC matrix to produce a rare earth-doped SiC matrix with improved material properties. Using CVI, the rare earth dopants can be substantially uniformly distributed in the SiC matrix or graduated in concentration by adjusting the flow of the rare earth dopant to the reactor to provide protection in regions more susceptible to oxidation or damage (e.g., outer region of the component or fibers of the preform). The rare earth-doped SiC matrix can mitigate recession of components during operation and increase component lifetime.

Summation

Any relative terms or terms of degree used herein, such as "substantially", "essentially", "generally", "approximately" and the like, should be interpreted in accordance with and subject to any applicable definitions or limits expressly stated herein. In all instances, any relative terms or terms of degree used herein should be interpreted to broadly encompass any relevant disclosed embodiments as well as such ranges or variations as would be understood by a person of ordinary skill in the art in view of the entirety of the present disclosure, such as to encompass ordinary manufacturing tolerance variations, incidental alignment variations, transient alignment or shape variations induced by thermal, rotational or vibrational operational conditions, and the like. Moreover, any relative terms or terms of degree used herein should be interpreted to encompass a range that expressly includes the designated quality, characteristic, parameter or value, without variation, as if no qualifying relative term or term of degree were utilized in the given disclosure or recitation.

Discussion of Possible Embodiments

The following are non-exclusive descriptions of possible embodiments of the present invention.

A method for forming ceramic matrix composite (CMC) component according to an exemplary embodiment of this disclosure among other possible things includes forming a fiber preform, positioning the fiber preform into a chemical vapor infiltration reactor chamber, and densifying the fiber preform. Densification includes infiltrating the fiber preform with a first gas comprising precursors of silicon carbide and infiltrating the fiber preform with a second gas comprising a first rare earth element, wherein the steps of infiltrating the fiber preform with the first gas and infiltrating the fiber preform with the second gas are conducted simultaneously to produce a first rare earth-doped silicon carbide matrix in a first region of the component.

The method of the preceding paragraph can optionally include, additionally and/or alternatively, any one or more of the following features, configurations, additional components, and/or steps:

A further embodiment of the foregoing method, wherein the second gas can comprise an organometallic compound.

A further embodiment of any of the foregoing methods, wherein the organometallic compound can be tris-cyclopentadienyl ytterbium.

A further embodiment of any of the foregoing methods, wherein the rare earth-doped matrix in the first region can comprise between 1 and 25 percent of the first rare earth element by atomic percent.

A further embodiment of any of the foregoing methods can further include varying a flow rate of the second gas into the reactor chamber to vary a concentration of the rare earth element in the doped silicon carbide matrix.

A further embodiment of any of the foregoing methods, wherein the flow rate of the second gas can be varied to provide a doped silicon carbide matrix region comprising a continuous gradient of the first rare earth element.

A further embodiment of any of the foregoing methods, wherein the flow rate of the second gas can be decreased as densification progresses outward from fibers of the fiber preform.

A further embodiment of any of the foregoing methods, wherein the flow rate of the second gas can be increased as densification progresses toward an outer boundary of the fiber preform.

A further embodiment of any of the foregoing methods, wherein further densification of the preform can include discontinuing flow of the second gas to the reactor chamber and infiltrating the fiber preform with only the first gas to form a first silicon carbide matrix in a second region outward from the first region.

A further embodiment of any of the foregoing methods, wherein further densification of the preform can include infiltrating the fiber preform with the first gas and the second gas to form the first rare earth-doped silicon carbide matrix in a third region outward from the second region, discontinuing flow of the second gas to the reactor chamber, and infiltrating the fiber preform with the first gas to form a second silicon carbide matrix in a fourth region adjacent to and outward from the third region and forming an outermost layer of the matrix.

A further embodiment of any of the foregoing methods can further include discontinuing flow of the second gas to the reactor chamber and infiltrating the fiber preform with the first gas and a third gas to form a second rare earth-doped silicon carbide matrix in a second region outward from the first region. The third gas can comprise a second rare earth element different from the first rare earth element.

A further embodiment of any of the foregoing methods, wherein the steps of infiltrating the fiber preform with the first gas and second gas and infiltrating the fiber preform with the first gas and third gas can be separated by a step of infiltrating the fiber preform with only the first gas to form a silicon carbide matrix region that separates the first and second regions.

A further embodiment of any of the foregoing methods can further include providing an interface coating on the fibers of the fiber preform prior to densification.

A ceramic matrix composite (CMC) according to an exemplary embodiment of this disclosure among other possible things includes a plurality of fibers and a first rare earth-doped silicon carbide matrix region surrounding the plurality of fibers. The first rare earth-doped silicon carbide matrix region comprises a first rare earth element.

The CMC of the preceding paragraph can optionally include, additionally and/or alternatively, any one or more of the following features, configurations, and/or additional components:

A further embodiment of the foregoing CMC can further include a silicon carbide matrix region disposed outward from the first rare earth-doped silicon carbide matrix region.

A further embodiment of any of the foregoing CMCs, wherein the silicon carbide matrix region can form an outmost matrix layer.

A further embodiment of any of the foregoing CMCs, wherein the first rare earth-doped silicon carbide matrix region can comprise a continuous gradient of the first rare earth element.

A further embodiment of any of the foregoing CMCs, wherein a concentration of the first rare earth element can decrease outward from the plurality of fibers to a region of low rare earth element concentration before increasing toward an outer layer of the matrix.

A further embodiment of any of the foregoing CMCs can further include a second rare earth-doped silicon carbide matrix region. The second rare earth-doped silicon carbide matrix region can comprise a second rare earth element different from the first rare earth element.

A further embodiment of any of the foregoing CMCs can further include a silicon carbide region separating the first and second rare earth-doped silicon carbide regions.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A method for forming ceramic matrix composite (CMC) component, the method comprising:
    forming a fiber preform;
    positioning the fiber preform into a chemical vapor infiltration reactor chamber; and
    densifying the fiber preform, wherein densification comprises:
        infiltrating the fiber preform with a first gas comprising precursors of silicon carbide;
        infiltrating the fiber preform with a second gas comprising a first rare earth element;
        wherein the steps of infiltrating the fiber preform with the first gas and infiltrating the fiber preform with the second gas are conducted simultaneously to produce a first rare earth-doped silicon carbide matrix in a first region of the component;
        discontinuing flow of the second gas to the reactor chamber;
        infiltrating the fiber preform with only the first gas to form a first silicon carbide matrix in a second region outward from the first region;
        infiltrating the fiber preform with the first gas and the second gas to form the first rare earth-doped silicon carbide matrix in a third region outward from the second region;
        discontinuing flow of the second gas to the reactor chamber; and
        infiltrating the fiber preform with the first gas to form a second silicon carbide matrix in a fourth region adjacent to and outward from the third region and forming an outermost layer of the matrix.

2. The method of claim 1, wherein the second gas comprises an organometallic compound.

3. The method of claim 2, wherein the organometallic compound is tris- cyclopentadienyl ytterbium.

4. The method of claim 1, wherein the rare earth-doped matrix in the first region comprises between 1 and 25 percent of the first rare earth element by atomic percent.

5. The method of claim 4, and further comprising varying a flow rate of the second gas into the reactor chamber to vary a concentration of the rare earth element in the doped silicon carbide matrix.

6. The method of claim 5, wherein the flow rate of the second gas is varied to provide a doped silicon carbide matrix region comprising a continuous gradient of the first rare earth element.

7. The method of claim 6, wherein the flow rate of the second gas is decreased as densification progresses outward from fibers of the fiber preform.

8. The method of claim 6, wherein the flow rate of the second gas is increased as densification progresses toward an outer boundary of the fiber preform.

9. The method of claim 1, and further comprising:
discontinuing flow of the second gas to the reactor chamber; and
infiltrating the fiber preform with the first gas and a third gas, the third gas comprising a second rare earth element different from the first rare earth element, to form a second rare earth-doped silicon carbide matrix in a fifth region outward from the first region.

10. The method of claim 1, and further comprising providing an interface coating on the fibers of the fiber preform prior to densification.

11. A method for forming ceramic matrix composite (CMC) component, the method comprising:
forming a fiber preform;
positioning the fiber preform into a chemical vapor infiltration reactor chamber; and
densifying the fiber preform, wherein densification comprises:
infiltrating the fiber preform with a first gas comprising precursors of silicon carbide; and
infiltrating the fiber preform with a second gas comprising a first rare earth element;
wherein the steps of infiltrating the fiber preform with the first gas and infiltrating the fiber preform with the second gas are conducted simultaneously to produce a first rare earth-doped silicon carbide matrix in a first region of the component;
discontinuing flow of the second gas to the reactor chamber; and
infiltrating the fiber preform with the first gas and a third gas, the third gas comprising a second rare earth element different from the first rare earth element, to form a second rare earth-doped silicon carbide matrix in a second region outward from the first region.

12. The method of claim 11, wherein the steps of infiltrating the fiber preform with the first gas and second gas and infiltrating the fiber preform with the first gas and third gas are separated by a step of infiltrating the fiber preform with only the first gas to form a first silicon carbide matrix in a third region that separates the first and second regions.

13. The method of claim 12, and further comprising:
discontinuing flow of the third gas to the reactor chamber; and
infiltrating the fiber preform with the first gas to form a second silicon carbide matrix in a fourth region adjacent to and outward from the second region and forming an outermost layer of the matrix.

14. The method of claim 11, wherein the first gas comprises a first organometallic compound and the second gas comprises a second organometallic compound.

15. A method for forming ceramic matrix composite (CMC) component, the method comprising:
forming a fiber preform;
positioning the fiber preform into a chemical vapor infiltration reactor chamber; and
densifying the fiber preform, wherein densification comprises:
infiltrating the fiber preform with a first gas comprising precursors of silicon carbide;
infiltrating the fiber preform with a second gas comprising a first rare earth element;
wherein the steps of infiltrating the fiber preform with the first gas and infiltrating the fiber preform with the second gas are conducted simultaneously to produce a first rare earth-doped silicon carbide matrix in a first region of the component;
decreasing a flow rate of the second gas as densification progresses outward from fibers of the fiber preform to form a matrix in a second region outward from the first region, wherein the first region adjacent to the fibers has a higher concentration of the first rare earth element than the second region; and
increasing the flow rate of the second gas as densification progresses toward an outer boundary of the fiber preform to form a matrix in a third region having a higher concentration of the first rare earth element than the second region, wherein the second region is disposed between the first and third regions.

16. The method of claim 15, wherein the second gas comprises tris-cyclopentadienyl ytterbium.

17. The method of claim 15, wherein the first rare earth-doped matrix in the first region comprises between 1 and 25 percent of the first rare earth element by atomic percent.

* * * * *